United States Patent
Endou et al.

(10) Patent No.: US 7,998,658 B2
(45) Date of Patent: Aug. 16, 2011

(54) PATTERN FORMING METHOD

(75) Inventors: Masayuki Endou, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/767,369

(22) Filed: Apr. 26, 2010

(65) Prior Publication Data

US 2010/0209850 A1    Aug. 19, 2010

Related U.S. Application Data

(63) Continuation of application No. PCT/JP2009/002341, filed on May 27, 2009.

(30) Foreign Application Priority Data

Jul. 4, 2008 (JP) ................................. 2008-176152

(51) Int. Cl.
*G03G 5/00* (2006.01)
*G03F 7/00* (2006.01)

(52) U.S. Cl. ........ 430/296; 430/312; 430/313; 430/315; 430/324; 430/394; 430/942; 430/945; 427/903; 438/763

(58) Field of Classification Search .................. 430/296, 430/312, 313, 315, 324, 394, 942, 945; 427/903; 438/763
See application file for complete search history.

(56) References Cited

U.S. PATENT DOCUMENTS

| 6,015,650 A | 1/2000 | Bae |
| 6,177,231 B1 | 1/2001 | Ishii et al. |
| 2005/0032254 A1 | 2/2005 | Cheng et al. |
| 2007/0020565 A1 | 1/2007 | Koh et al. |
| 2010/0003622 A1 | 1/2010 | Matsumaru et al. |
| 2010/0035177 A1 | 2/2010 | Ishikawa et al. |

FOREIGN PATENT DOCUMENTS

| JP | 04-071222 | 3/1992 |
| JP | 08-179107 | 7/1996 |
| JP | 9-205081 | 8/1997 |
| JP | 3515326 | 4/2004 |
| JP | 2005-241963 | 9/2005 |
| JP | 2006-189612 | 7/2006 |
| JP | 2007-529088 | 10/2007 |
| JP | 2008-033174 | 2/2008 |
| JP | 2008-046206 | 2/2008 |
| JP | 2008-083537 | 4/2008 |
| JP | 2008-129423 | 6/2008 |

OTHER PUBLICATIONS

M. Maenhoudt et al., "Double Patterning scheme for sub-0.25 k1 single damascene structures at NA=0.75, λ=193nm," Proc. SPIE, vol. 5754, pp. 1508, 2005.

*Primary Examiner* — Christopher Young

(74) *Attorney, Agent, or Firm* — McDermott Will & Emery LLP

(57) ABSTRACT

A first resist film is formed on a substrate, and first pattern exposure is performed such that the first resist film is irradiated with exposure light through a first mask. Then, the first resist film is developed, thereby forming a first resist pattern out of the first resist film. Subsequently, a nano-carbon material is attached to the surface of the first resist pattern, and then a second resist film is formed on the substrate including the first resist pattern. Thereafter, second pattern exposure is performed such that the second resist film is irradiated with exposure light through a second mask. Then, the second resist film is developed, thereby forming a second resist pattern out of the second resist film.

19 Claims, 14 Drawing Sheets

PATTERN FORMING METHOD

CROSS-REFERENCE TO RELATED APPLICATIONS

This is a continuation of PCT International Application PCT/JP2009/002341 filed on May 27, 2009, which claims priority to Japanese Patent Application No. 2008-176152 filed on Jul. 4, 2008. The disclosures of these applications including the specifications, the drawings, and the claims are hereby incorporated by reference in their entirety.

BACKGROUND

The present disclosure relates to pattern forming methods for use in, for example, processes for fabricating semiconductor devices.

With increasing integration of semiconductor integrated circuits and downsizing of semiconductor elements, there has been a demand for acceleration of the development of lithography techniques. At present, pattern formation is performed by photolithography using mercury lamps, KrF excimer lasers, ArF excimer lasers, or the like, as sources of exposure light. Further, the use of $F_2$ laser light having a shorter wavelength of 157 nm was also studied, but is not currently developed because there are still problems in exposure apparatus and resist materials.

Under such circumstances, to further miniaturize patterns by using conventional exposure wavelengths, a technique called double patterning has been recently proposed (see, for example, M. Maenhoudt, J. Versluijs, H. Struyf, J. Van Olmen, and M. Van Hove, "Double Patterning scheme for sub-0.25 k1 single damascene structures at NA=0.75, $\lambda$=193 nm," Proc. SPIE, vol. 5754, p. 1508 (2005)).

With the double patterning technique, a desired mask pattern is divided into two masks which are individually subjected to light exposure, thereby enhancing pattern contrast. The resolution in lithography is defined by k1·$\lambda$/NA (where k1 is a process constant, $\lambda$ is the wavelength of exposure light, and NA is the numerical aperture of exposure apparatus). With the double patterning technique, the enhanced pattern contrast significantly reduces the value of the process constant (k1). Accordingly, the resolution can be greatly increased with a light source using the same wavelength of exposure light.

A pattern forming method using a conventional double patterning technique will be described hereinafter with reference to FIGS. 13A-13D and 14A-14D.

First, a chemically amplified positive resist material having the following composition is prepared.

| | |
|---|---|
| Base polymer: poly((t-butyl-norbornene-5-methylenecarboxylate) (50 mol %) - (maleic anhydride) (50 mol %)) | 2 g |
| Acid generator: triphenylsulfonium trifluoromethanesulfonic acid | 0.05 g |
| Quencher: triethanolamine | 0.002 g |
| Solvent: propylene glycol monomethyl ether acetate | 20 g |

Next, as shown in FIG. 13A, the chemically amplified resist material is applied on a substrate 1 to form a first resist film 2 with a thickness of 0.12 μm.

Then, as shown in FIG. 13B, the first resist film 2 is irradiated with exposure light which is ArF excimer laser light having an NA of 0.93 through a first mask 3A.

After the pattern exposure, as shown in FIG. 13C, the first resist film 2 is heated with a hot plate at a temperature of 105° C. for 60 seconds. Thereafter, as shown in FIG. 13D, the first resist film 2 is developed with a 2.38 wt % tetramethylammonium hydroxide developer, thereby obtaining a first resist pattern 2a made of an unexposed portion of the first resist film 2.

Subsequently, as shown in FIG. 14A, the chemically amplified resist material is applied on the substrate 1 including the first resist pattern 2a to form a second resist film 4 with a thickness of 0.12 μm.

Then, as shown in FIG. 14B, the second resist film 4 is irradiated with exposure light which is ArF excimer laser light having an NA of 0.93 through a second mask 3B.

After the pattern exposure, as shown in FIG. 14C, the second resist film 4 is heated with a hot plate at a temperature of 105° C. for 60 seconds. Thereafter, as shown in FIG. 14D, the second resist film 4 is developed with a 2.38 wt % tetramethylammonium hydroxide developer, thereby obtaining a second resist pattern 4a made of an unexposed portion of the second resist film 4.

In this manner, A process including two lithography steps and an etching step in the double patterning technique has a simple pattern forming process, and thus, is industrially promising.

SUMMARY

However, in the conventional double patterning technique, in forming the second resist film 4 on the first resist pattern 2a as shown in FIG. 14A, the first resist pattern 2a is dissolved in a solvent of the second resist film 4, thereby forming a defective pattern showing so-called thickness reduction. Further, the second resist pattern 4a also has its composition changed by mixing with the first resist pattern 2a, thereby forming a defective pattern.

In this manner, when a target film is etched using the first resist pattern 2a and the second resist pattern 4a having defective shapes, the pattern obtained from the target film also has a defective shape, thereby causing problems of decreases in productivity and yield in processes for fabricating semiconductor devices.

It is therefore an object of the present invention to reduce pattern defects in double patterning so as to obtain a fine pattern having a desired shape.

The inventors of the present invention conducted various studies on conventional double patterning techniques, resulting in the following findings. Attachment of a nano-carbon material to the surface of the first resist pattern which is formed first increases the rigidity of the first resist pattern. Accordingly, it is possible to reduce problems, such as chemical mixing in the solvent or pattern collapse caused by physical stress in pattern formation, in forming the second resist film. In this manner, the second resist pattern can be formed with the shape of the first resist pattern accurately maintained, thereby forming a fine pattern using the first resist pattern and the second resist pattern.

The nano-carbon material also enters space in the first resist pattern, i.e., is also attached to the surface of the substrate, but does not adversely affect a subsequent etching step. This is because the influence of the attachment of nano-carbon molecules is not strong enough to inhibit etching.

In addition, the nano-carbon material is an organic substance of the same type as the resist material, and thus, has high adhesion once being attached to the surface. Accordingly, the nano-carbon material is less likely to be peeled off during formation of the second resist film.

Based on the foregoing findings, the present invention has been achieved in the following manner.

A first pattern forming method according to the present invention includes the steps of: (a) forming a first resist film on a substrate; (b) irradiating the first resist film with exposure light through a first mask, thereby performing first pattern exposure; (c) developing the first resist film after step (b), thereby forming a first resist pattern out of the first resist film; (d) attaching a nano-carbon material to a surface of the first resist pattern after step (c); (e) forming a second resist film on the substrate including the first resist pattern after step (d); (f) irradiating the second resist film with exposure light through a second mask, thereby performing second pattern exposure; and (g) developing the second resist film after step (f), thereby forming a second resist pattern out of the second resist film.

In the first pattern forming method, after formation of the first resist pattern, the nano-carbon material is attached to the surface of the first resist pattern. Accordingly, in forming the second resist film on the substrate including the first resist pattern, mixing with the second resist film can be prevented. Further, the attached nano-carbon material can increase the rigidity of the first resist pattern, thereby reducing problems such as pattern collapse caused by physical stress in pattern formation.

A second pattern forming method according to the present invention includes the steps of: (a) forming a first resist film on a substrate; (b) irradiating the first resist film with exposure light through a first mask with a liquid provided on the first resist film, thereby performing first pattern exposure; (c) developing the first resist film after step (b), thereby forming a first resist pattern out of the first resist film; (d) attaching a nano-carbon material to a surface of the first resist pattern after step (c); (e) forming a second resist film on the substrate including the first resist pattern after step (d); (f) irradiating the second resist film with exposure light through a second mask with a liquid provided on the second resist film, thereby performing second pattern exposure; and (g) developing the second resist film after step (f), thereby forming a second resist pattern out of the second resist film.

As obtained in the second pattern forming method, immersion lithography can obtain the same advantages as those of dry exposure in the first pattern forming method. In addition, in immersion lithography, resolution of the pattern and depth of focus can be increased. Thus, the present invention is useful for forming finer patterns.

In the first or second pattern forming method, the nano-carbon material may be one of carbon nanotubes, carbon nanohorns, and fullerenes.

In the first or second pattern forming method, in step (d), the first resist pattern is preferably immersed in a dispersion solution in which the nano-carbon material is dispersed.

In this case, a dispersion medium of the dispersion solution may be one of water and alcohol.

In this case, alcohol as the dispersion medium of the dispersion solution may be one of n-butyl alcohol, isobutyl alcohol, sec-butyl alcohol, tert-butyl alcohol, and isoamyl alcohol.

The second pattern forming method preferably further includes the step (h) of forming a first barrier film on the first resist film between steps (a) and (b), and in step (b), the first pattern exposure is preferably performed with the liquid provided on the first barrier film.

In this case, step (c) preferably includes the step of removing the first barrier film.

Alternatively, in this case, the second pattern forming method preferably further includes the step (i) of removing the first barrier film between steps (b) and (c).

The second pattern forming method preferably further includes the step (j) of forming a second barrier film on the second resist film between steps (e) and (f), and in step (f), the second pattern exposure is preferably performed with the liquid provided on the second barrier film.

In this case, step (g) preferably includes the step of removing the second barrier film.

Alternatively, in this case, the second pattern forming method preferably further includes the step (k) of removing the second barrier film between steps (f) and (g).

In this manner, in the second pattern forming method, a barrier film which can prevent interference between the liquid and the resist film may be provided on the first or second resist film. To prevent elution of components from the resist film in the liquid or penetration of the liquid into the resist film, the advantages of immersion lithography and advantages of double patterning obtained according to the present invention can be more effectively achieved.

The barrier film may be removed in or before the development process. If the barrier film is removed in the development process, the dissolution property of the resist film can be controlled, thereby increasing resolution. On the other hand, if the barrier film is removed before the development process, the resist film can be smoothly developed as usual.

In the second pattern forming method, the first barrier film may contain polymer, and polymer contained in the first barrier film may be one of polyvinyl alcohol, polyacrylic acid, and polyvinyl hexafluoroisopropyl alcohol.

In the second pattern forming method, the second barrier film may contain polymer, and polymer contained in the second barrier film may be one of polyvinyl alcohol, polyacrylic acid, and polyvinyl hexafluoroisopropyl alcohol.

The second pattern forming method preferably further includes the step (l) of heating the first barrier film between steps (h) and (b).

The second pattern forming method preferably further includes the step (m) of heating the second barrier film between steps (j) and (f).

In the second pattern forming method, the liquid may be one of water and perfluoropolyether.

In the second pattern forming method, the liquid may be an acid solution.

In this case, the acid solution may be one of a cesium sulfate solution and a phosphoric acid solution.

In the first pattern forming method, the exposure light may be one of KrF excimer laser light, $Xe_2$ laser light, ArF excimer laser light, $F_2$ laser light, KrAr laser light, $Ar_2$ laser light, extreme ultraviolet light, and electron beams.

In the second pattern forming method, the exposure light may be one of KrF excimer laser light, $Xe_2$ laser light, ArF excimer laser light, $F_2$ laser light, KrAr laser light, and $Ar_2$ laser light.

As a conventional technique, a technique for increasing etching resistance of a resist by adding fullerenes or carbon nanotubes to a resist material (see, for example, Japanese Patent No. 3515326). On the other hand, according to the present invention, after formation of a first resist pattern, a nano-carbon material is attached to a pattern surface in order to increase the rigidity of the first resist pattern, and thus, is different from the conventional technique in this aspect. Further, In Japanese Patent No. 3515326, since the resist itself contains fullerenes or carbon nanotubes, properties (e.g., sensitivity and resolution) of the resist might change. On the other hand, according to the present invention, since the nano-carbon material is attached to the pattern surface after formation of the pattern, properties of the resist are not affected at all. In this regard, the technique of the present invention differs from the conventional technique.

A pattern forming method according to the present invention can reduce pattern failures in double patterning to provide a fine pattern with a desired shape.

DETAILED DESCRIPTION

First Embodiment

A pattern forming method according to a first embodiment of the present invention will be described with reference to FIGS. 1A-1D, 2A-2D, 3A, and 3B.

First, a chemically amplified positive resist material having the following composition is prepared.

| | |
|---|---|
| Base polymer: poly((t-butyl-norbornene-5-methylenecarboxylate) (50 mol %) - (maleic anhydride) (50 mol %)) | 2 g |
| Acid generator: triphenylsulfonium trifluoromethanesulfonic acid | 0.05 g |
| *-continued* | |
| Quencher: triethanolamine | 0.002 g |
| Solvent: propylene glycol monomethyl ether acetate | 20 g |

Figure 1A:
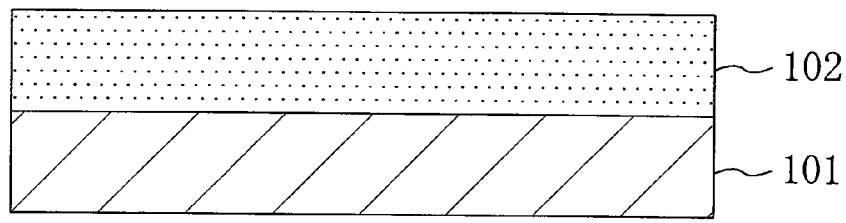
FIGS. 1A-1D are cross-sectional views illustrating process steps of a pattern forming method according to a first embodiment.

Next, as shown in FIG. 1A, the chemically amplified resist material is applied on the anti-reflection principal surface of a substrate 101 to form a first resist film 102 with a thickness of 0.12 μm.

Figure 1B:
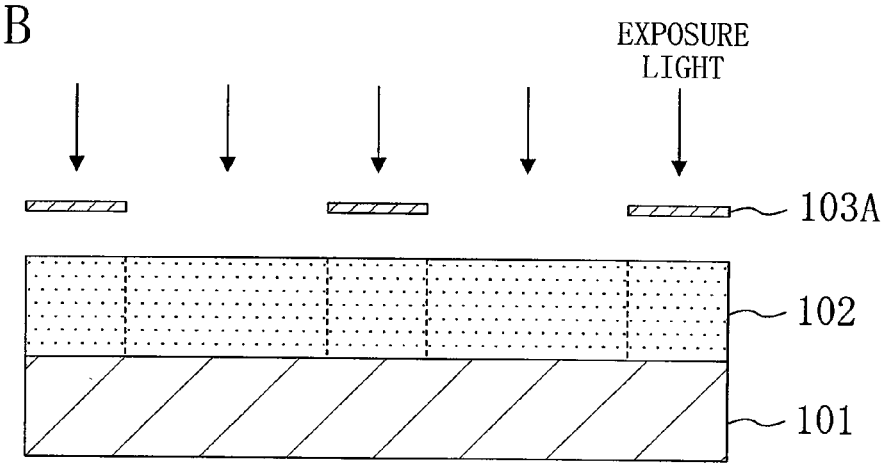

Then, as shown in FIG. 1B, the first resist film 102 is irradiated with exposure light which is ArF excimer laser light having an NA of 0.93 through a first mask 103A.

Figure 1C:
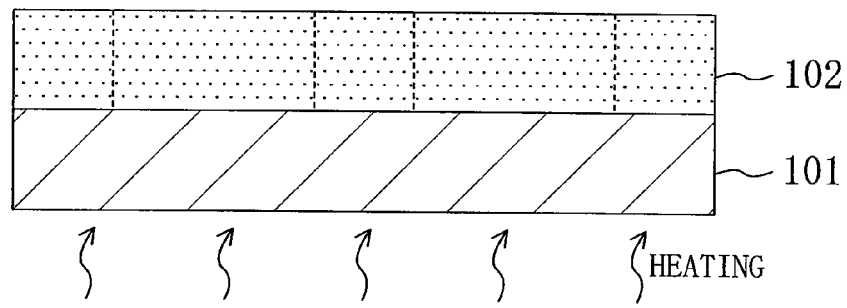
Figure 1D:
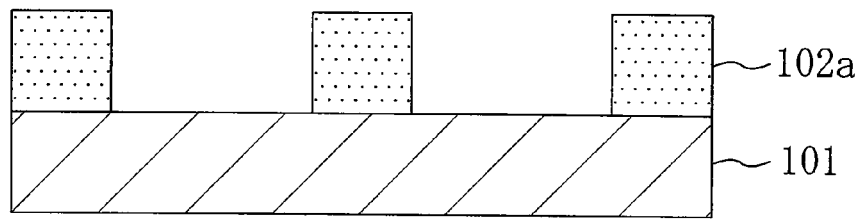

After the pattern exposure, as shown in FIG. 1C, the first resist film 102 is heated with, for example, a hot plate at a temperature of 105° C. for 60 seconds. Thereafter, as shown in FIG. 1D, the first resist film 102 is developed with a 2.38 wt % tetramethylammonium hydroxide developer, thereby obtaining a first resist pattern 102a made of an unexposed portion of the resist film 102 and having a line-and-space pattern with a pitch of 200 nm.

Figure 2A:
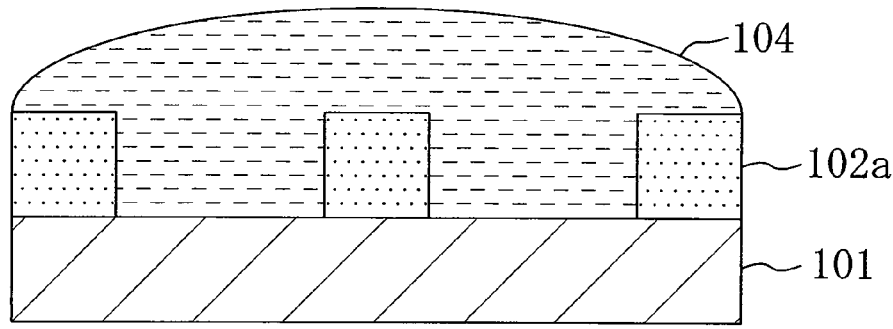
FIGS. 2A-2D are cross-sectional views illustrating process steps of the pattern forming method of the first embodiment.
Figure 2B:
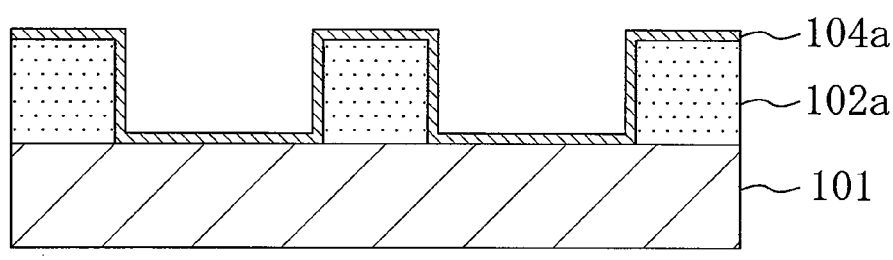

Subsequently, as shown in FIG. 2A, the first resist pattern 102a is immersed by, for example, a puddle method for 60 seconds in a dispersion solution 104 in which carbon nanotubes each having a diameter of 1 nm and a length of 2 μm are dispersed in n-butyl alcohol in a concentration of 15 wt %. In this manner, as shown in FIG. 2B, a nano-carbon layer 104a which has a thickness of about 1.2 nm and to which the carbon nanotubes are attached is formed on the surface of the first resist pattern 102a.

Figure 2C:
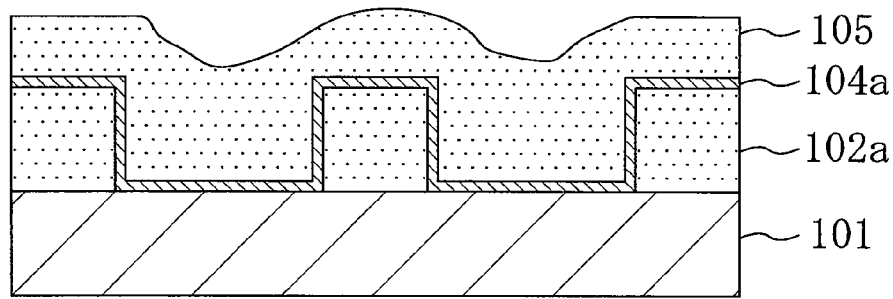

Then, as shown in FIG. 2C, the chemically amplified resist material is applied again on the principal surface of the substrate 101 including the first resist pattern 102a on which the nano-carbon layer 104a is formed, thereby forming a second resist film 105 with a thickness of 0.12 μm. At this time, since the nano-carbon layer 104a to which the carbon nanotubes are attached is formed on the surface of the first resist pattern 102a, the rigidity of the first resist pattern 102a can be enhanced and, in addition, mixing of the first resist pattern 102a and the second resist film 105 can be prevented, thereby maintaining a desired shape of the first resist pattern 102a.

Figure 2D:
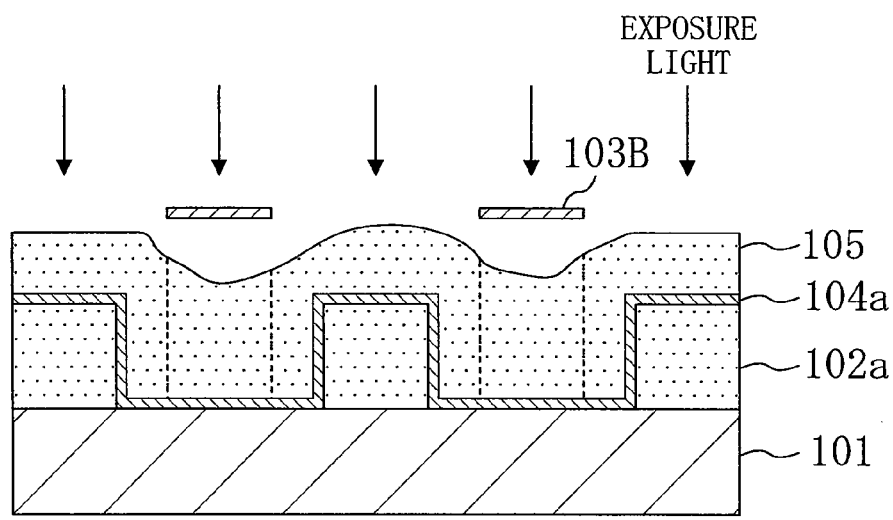

Thereafter, as shown in FIG. 2D, the second resist film 105 is irradiated with exposure light which is ArF excimer laser light having an NA of 0.93 through a second mask 103B.

Figure 3A:
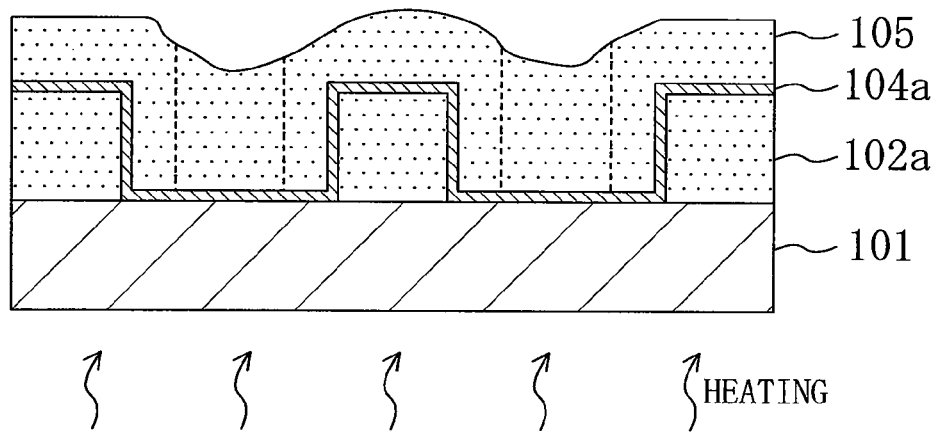
FIGS. 3A and 3B are cross-sectional views illustrating process steps of the pattern forming method of the first embodiment.
Figure 3B:
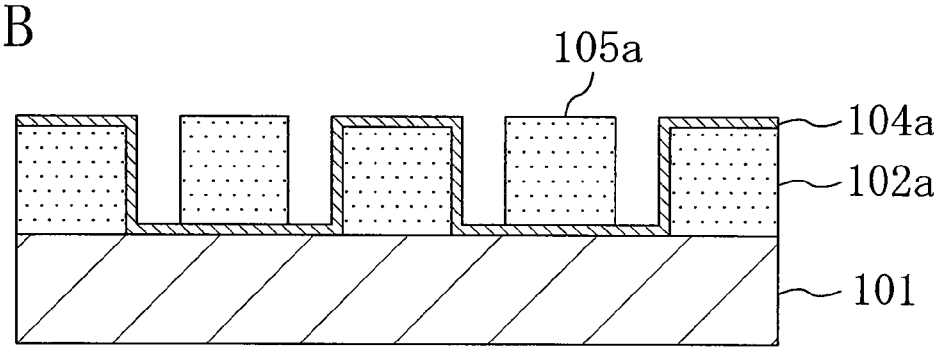

After the pattern exposure, as shown in FIG. 3A, the second resist film 105 is heated with, for example, a hot plate at a temperature of 105° C. for 60 seconds. Thereafter, as shown in FIG. 3B, the second resist film 105 is developed with a 2.38 wt % tetramethylammonium hydroxide developer, thereby obtaining a second resist pattern 105a made of an unexposed portion of the second resist film 105 and having a line-and-space pattern with a pitch of 200 nm.

In this manner, in the first embodiment, a very-fine pattern having a desired shape of a line-and-space pattern with a pitch of 100 nm can be obtained by utilizing the first resist pattern 102a whose desired shape is maintained with the nano-carbon layer 104a attached to the surface thereof and the second resist pattern 105a having a desired shape. In the first embodiment, ArF excimer laser is used as exposure light. Alternatively, KrF excimer laser light, $Xe_2$ laser light, $F_2$ laser light, KrAr laser light, $Ar_2$ laser light, ultraviolet light, or electron beams may be used.

Second Embodiment

A pattern forming method according to a second embodiment of the present invention will be described hereinafter with reference to FIGS. 4A-4D, 5A-5D, 6A, and 6B.

First, a chemically amplified positive resist material having the following composition is prepared.

| | |
|---|---|
| Base polymer: poly((t-butyl-norbornene-5-methylenecarboxylate) (50 mol %) - (maleic anhydride) (50 mol %)) | 2 g |
| Acid generator: triphenylsulfonium trifluoromethanesulfonic acid | 0.05 g |
| Quencher: triethanolamine | 0.002 g |
| Solvent: propylene glycol monomethyl ether acetate | 20 g |

Figure 4A:
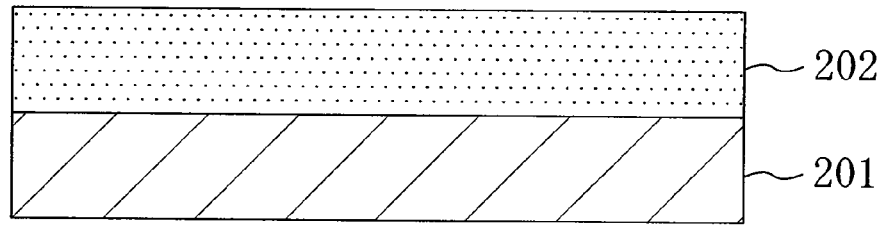
FIGS. 4A-4D are cross-sectional views illustrating process steps of a pattern forming method according to a second embodiment.

Next, as shown in FIG. 4A, the chemically amplified resist material is applied on the anti-reflection principal surface of a substrate 201 to form a first resist film 202 with a thickness of 0.12 μm.

Figure 4B:
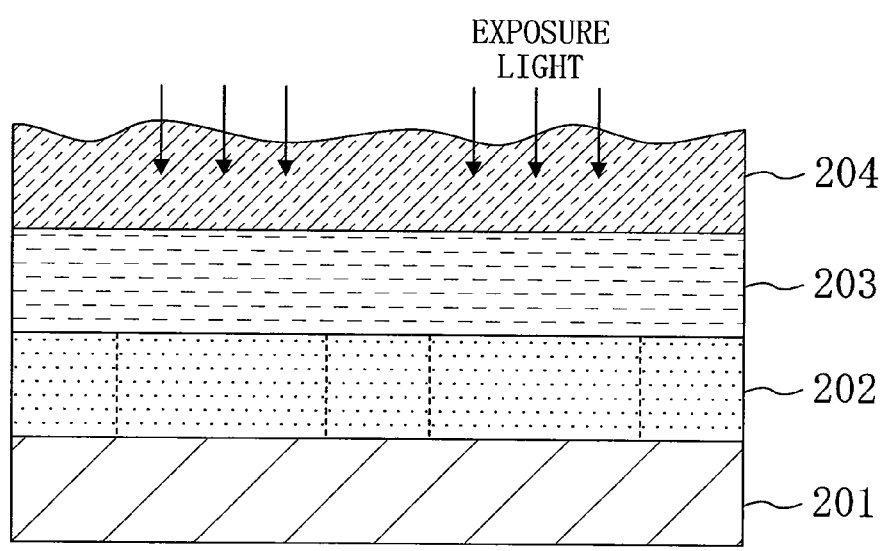

Subsequently, as shown in FIG. 4B, with an immersion liquid 203 of water provided between the first resist film 202 and a projection lens 204 by, for example, a puddle method, pattern exposure is carried out by irradiating the first resist film 202 with exposure light which is ArF excimer laser light having an NA of 1.07 through a first mask (not shown).

Figure 4C:
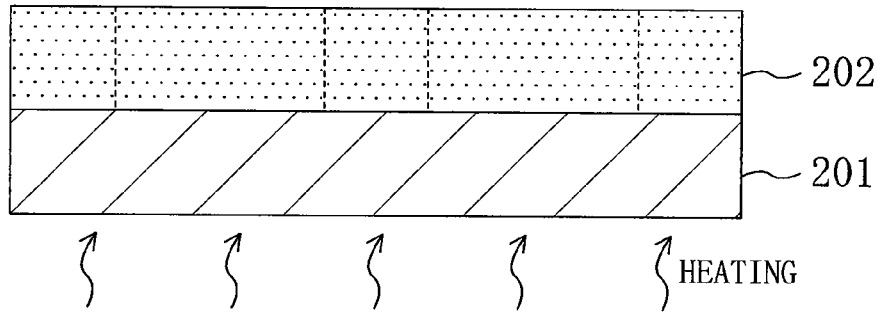
Figure 4D:
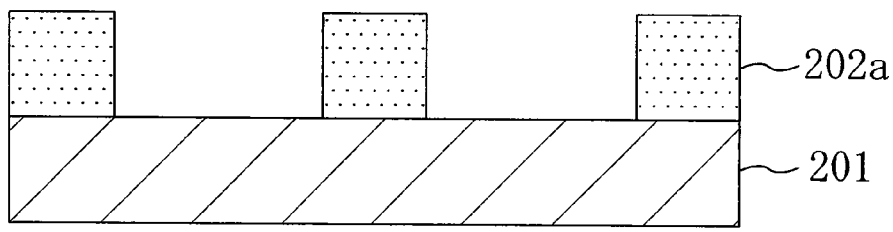

After the pattern exposure, as shown in FIG. 4C, the first resist film 202 is heated with, for example, a hot plate at a temperature of 105° C. for 60 seconds. Then, as shown in FIG. 4D, the first resist film 202 is developed with a 2.38 wt % tetramethylammonium hydroxide developer, thereby obtaining a first resist pattern 202a made of an unexposed portion of the first resist film 202 and having a line-and-space pattern with a pitch of 180 nm.

Figure 5A:
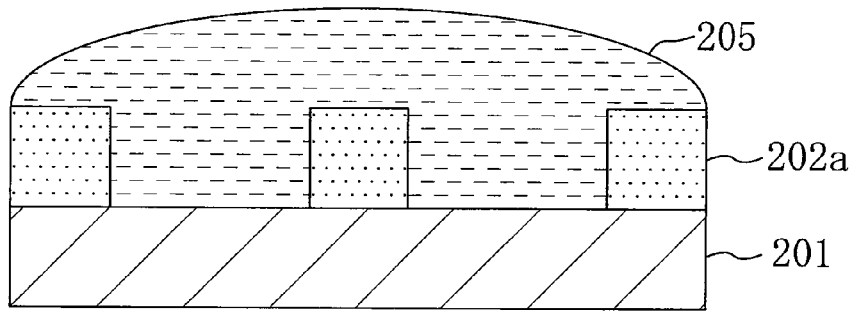
FIGS. 5A-5D are cross-sectional views illustrating process steps of the pattern forming method of the second embodiment.
Figure 5B:
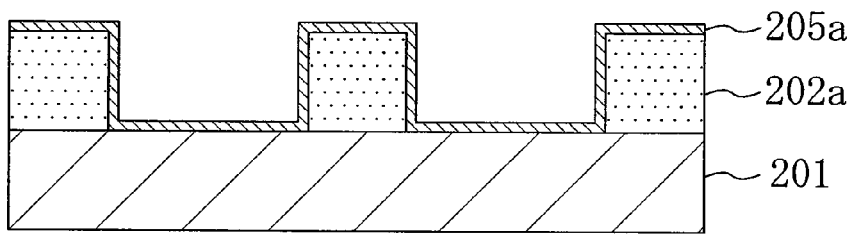

Thereafter, as shown in FIG. 5A, the first resist pattern 202a is immersed by, for example, a puddle method for 60 seconds in a dispersion solution 205 in which carbon nanotubes each having a diameter of 0.5 nm and a length of 3 μm is dispersed in sec-butyl alcohol in a concentration of 10 wt %. In this manner, as shown in FIG. 5B, the carbon nanotubes are attached to the surface of the first resist pattern 202a, thereby forming a nano-carbon layer 205a with a thickness of 0.7 nm.

Figure 5C:
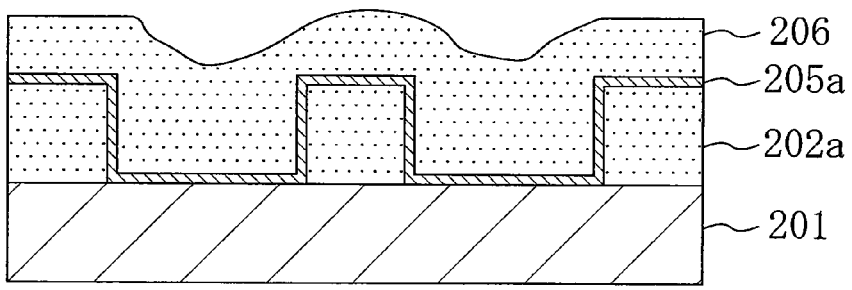

Then, as shown in FIG. 5C, the chemically amplified resist material is applied again on the principal surface of the substrate 201 including the first resist pattern 202a on which the nano-carbon layer 205a is formed, thereby forming a second resist film 206 with a thickness of 0.12 μm. At this time, since the nano-carbon layer 205a to which the carbon nanotubes are attached is formed on the first resist pattern 202a, the rigidity of the first resist pattern 202a can be enhanced, and in addition, mixing of the first resist pattern 202a and the second resist film 206 can be prevented, thereby maintaining a desired shape of the first resist pattern 202a.

Figure 5D:
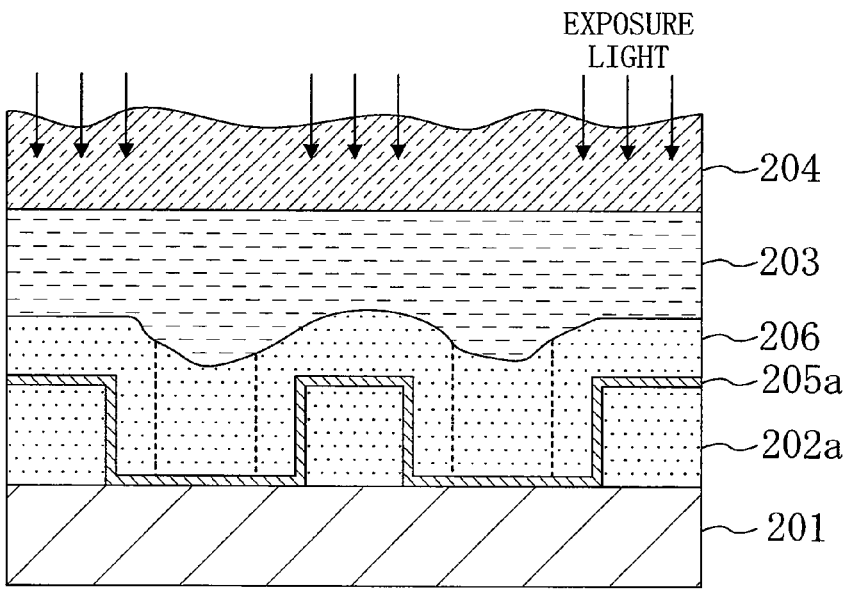

Subsequently, as shown in FIG. 5D, with the immersion liquid 203 of water provided between the second resist film 206 and the projection lens 204 by, for example, a puddle method, pattern exposure is carried out by irradiating the second resist film 206 with exposure light which is ArF excimer laser light having an NA of 1.07 through a second mask (not shown).

Figure 6A:
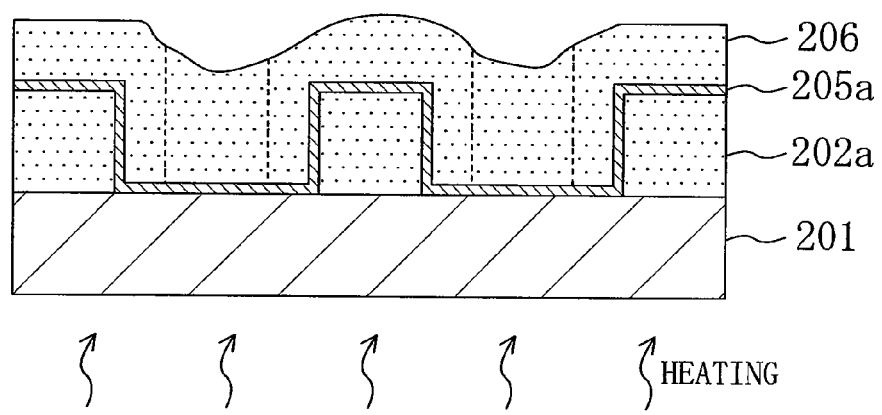
FIGS. 6A and 6B are cross-sectional views illustrating process steps of the pattern forming method of the second embodiment.
Figure 6B:
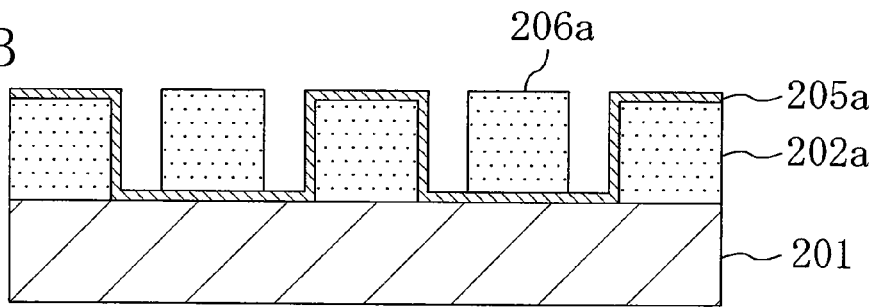

After the pattern exposure, as shown in FIG. 6A, the second resist film 206 is heated with, for example, a hot plate at a temperature of 105° C. for 60 seconds. Then, as shown in FIG. 6B, the second resist film 206 is developed with a 2.38 wt % tetramethylammonium hydroxide developer, thereby obtaining a second resist pattern 206a made of an unexposed portion of the second resist film 206 and having a line-and-space pattern with a pitch of 180 nm.

In this manner, in the second embodiment, a very-fine pattern having a desired shape of a line-and-space pattern with a pitch of 90 nm can be obtained by utilizing the first resist pattern 202a whose desired shape is maintained with the nano-carbon layer 205a attached to the surface thereof and the second resist pattern 206a having a desired shape.

Third Embodiment

A pattern forming method according to a third embodiment of the present invention will be described hereinafter with reference to FIGS. 7A-7D, 8A-8D, 9A, and 9B.

First, a chemically amplified positive resist material having the following composition is prepared.

| | |
|---|---|
| Base polymer: poly((t-butyl-norbornene-5-methylenecarboxylate) (50 mol %) - (maleic anhydride) (50 mol %)) | 2 g |
| Acid generator: triphenylsulfonium trifluoromethanesulfonic acid | 0.05 g |
| Quencher: triethanolamine | 0.002 g |
| Solvent: propylene glycol monomethyl ether acetate | 20 g |

Figure 7A:
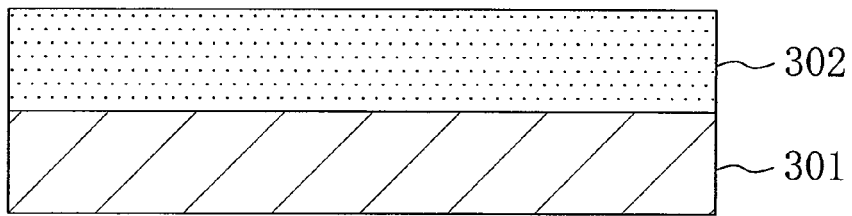
FIGS. 7A-7D are cross-sectional views illustrating process steps of a pattern forming method according to a third embodiment.

Next, as shown in FIG. 7A, the chemically amplified resist material is applied on the anti-reflection principal surface of a substrate 301 to form a first resist film 302 with a thickness of 0.12 μm.

Figure 7B:
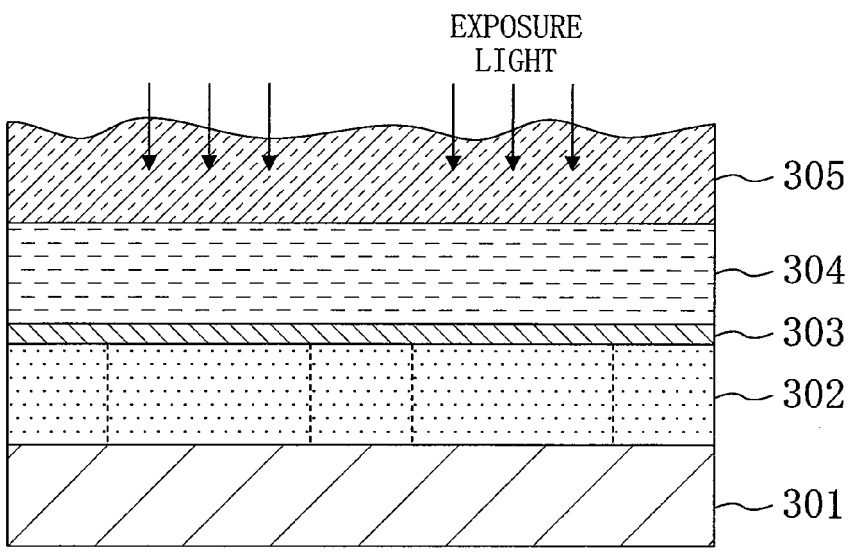

Then, as shown in FIG. 7B, a first barrier film 303 with a thickness of 0.07 μm is formed by, for example, spin coating on the first resist film 302 out of a barrier film material having the following composition:

| | |
|---|---|
| Base polymer: polyvinyl alcohol | 1 g |
| Solvent: n-butyl alcohol | 20 g |

Subsequently, with an immersion liquid 304 of water provided between the first barrier film 303 and a projection lens 305 by, for example, a puddle method, pattern exposure is carried out by irradiating the first resist film 302 with exposure light which is ArF excimer laser light having an NA of 1.07 through a first mask (not shown).

Figure 7C:
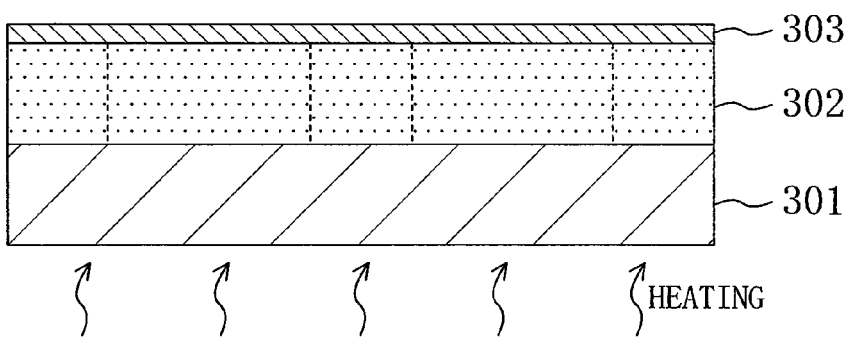
Figure 7D:
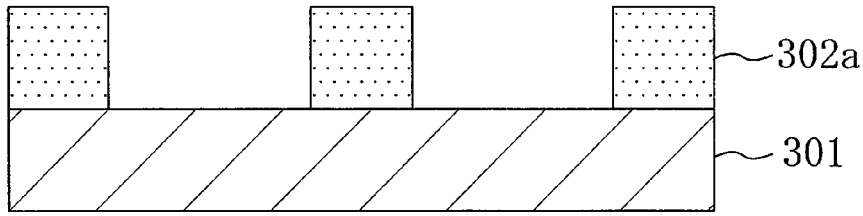

After the pattern exposure, as shown in FIG. 7C, the first resist film 302 is heated with, for example, a hot plate at a temperature of 105° C. for 60 seconds. Then, as shown in FIG. 7D, the first barrier film 303 is removed with a 2.38 wt % tetramethylammonium hydroxide developer, and the development is further performed, thereby obtaining a first resist pattern 302a made of an unexposed portion of the first resist film 302 and having a line-and-space pattern with a pitch of 180 nm.

Figure 8A:
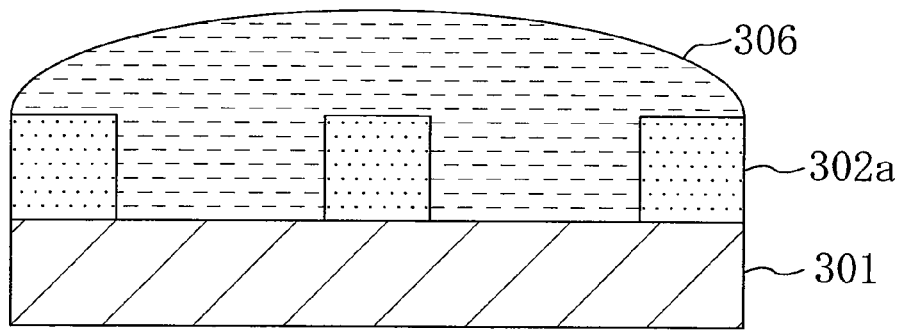
FIGS. 8A-8D are cross-sectional views illustrating process steps of the pattern forming method of the third embodiment.
Figure 8B:
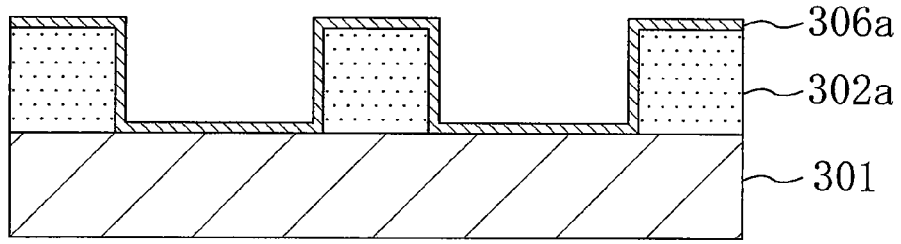

Thereafter, as shown in FIG. 8A, the first resist pattern 302a is immersed by, for example, a puddle method for 45 seconds in a dispersion solution 306 in which carbon nanohorns each having a diameter of 1 nm and a length of 1 μm are dispersed in a concentration of 8 wt %. In this manner, as shown in FIG. 8B, the carbon nanohorns are attached to the surface of the first resist pattern 302a, thereby forming a nano-carbon layer 306a with a thickness of about 1 nm.

Figure 8C:
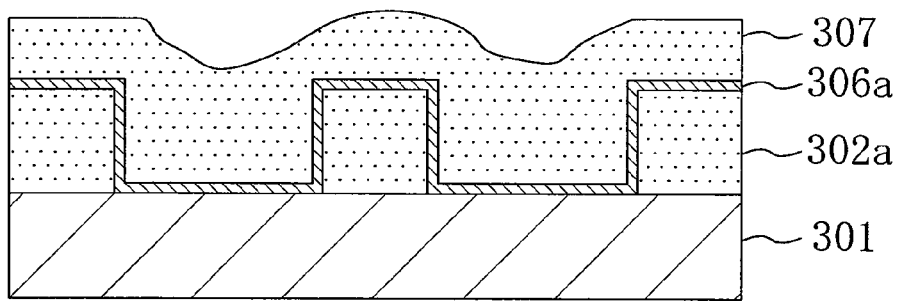

Then, as shown in FIG. 8C, the chemically amplified resist material is applied again on the principal surface of the substrate 301 including the first resist pattern 302a on which the nano-carbon layer 306a is formed, thereby forming a second resist film 307 with a thickness of 0.12 μm. At this time, since the nano-carbon layer 306a to which the carbon nanohorns are attached is formed on the first resist pattern 302a, the rigidity of the first resist pattern 302a can be enhanced, and in addition, mixing of the first resist pattern 302a and the second resist film 307 can be prevented, thereby maintaining a desired shape of the first resist pattern 302a.

Figure 8D:
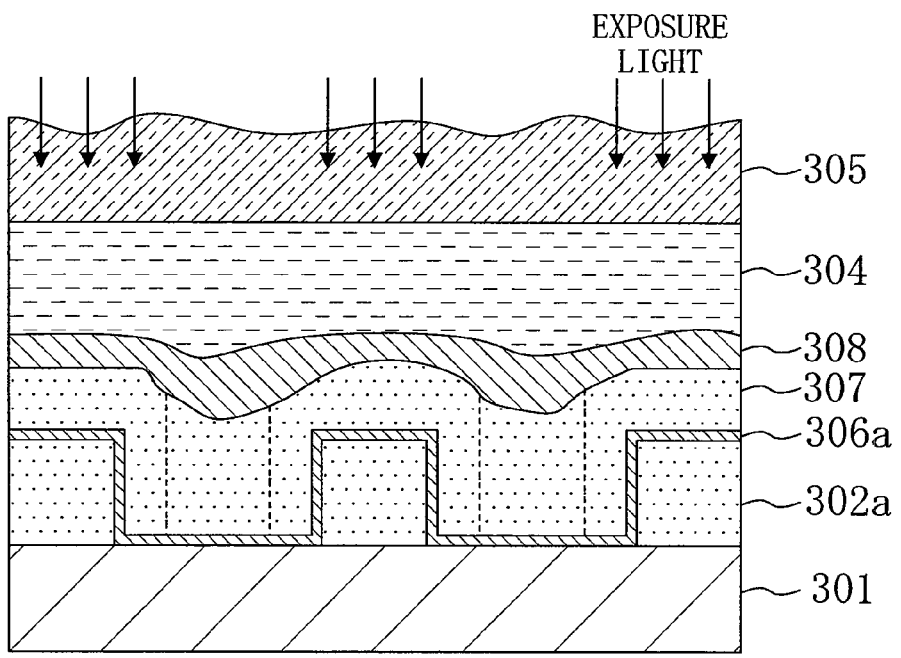

Subsequently, as shown in FIG. 8D, spin coating, for example, is performed such that a second barrier film 308 with a thickness of 0.07 μm is formed on the second resist film 307 out of a barrier film material having the composition described above. Then, with an immersion liquid 304 of water provided between the second barrier film 308 and a projection lens 305 by, for example, a puddle method, pattern exposure is carried out by irradiating the second resist film 307 with exposure light which is ArF excimer laser light having an NA of 1.07 through a second mask (not shown).

Figure 9A:
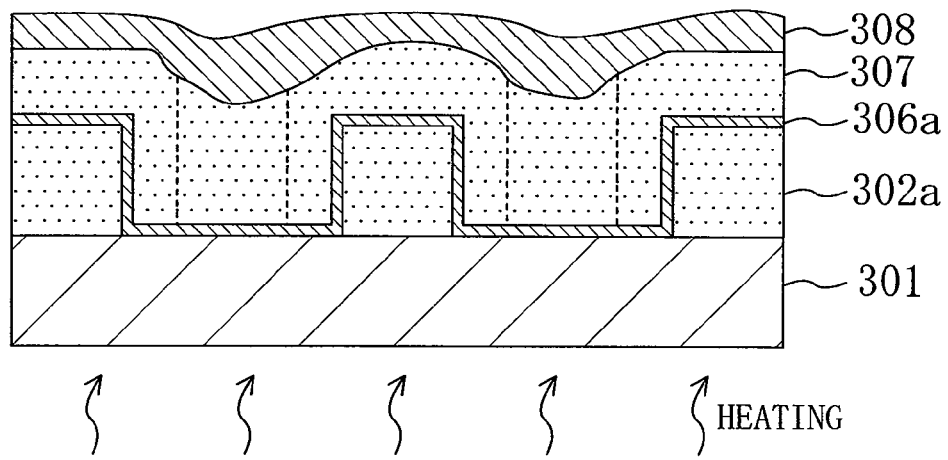
FIGS. 9A and 9B are cross-sectional views illustrating process steps of the pattern forming method of the third embodiment.
Figure 9B:
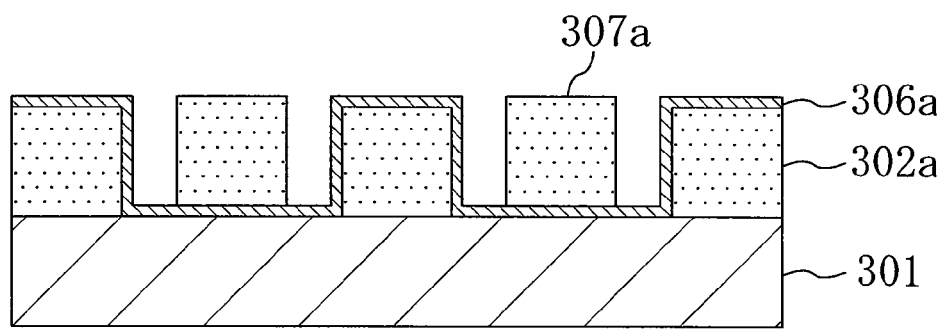

After the pattern exposure, as shown in FIG. 9A, the second resist film 307 is heated with, for example, a hot plate at a temperature of 105° C. for 60 seconds. Then, as shown in FIG. 9B, the second barrier film 308 is removed with a 2.38 wt % tetramethylammonium hydroxide developer, and the development is further performed, thereby obtaining a second resist pattern 307a made of an unexposed portion of the second resist film 307 and having a line-and-space pattern with a pitch of 180 nm.

In this manner, in the third embodiment, a very-fine pattern having a desired shape of a line-and-space pattern with a pitch of 90 nm can be obtained by utilizing the first resist pattern 302a whose desired shape is maintained with the nano-carbon layer 306a attached to the surface thereof and the second resist pattern 307a having a desired shape.

Fourth Embodiment

A pattern forming method according to a fourth embodiment of the present invention will be described hereinafter with reference to FIGS. 10A-10D, 11A-11D, and 12A-12D.

First, a chemically amplified positive resist material having the following composition is prepared.

| | |
|---|---|
| Base polymer: poly((t-butyl-norbornene-5-methylenecarboxylate) (50 mol %) - (maleic anhydride) (50 mol %)) | 2 g |
| Acid generator: triphenylsulfonium trifluoromethanesulfonic acid | 0.05 g |
| Quencher: triethanolamine | 0.002 g |
| Solvent: propylene glycol monomethyl ether acetate | 20 g |

Figure 10A:
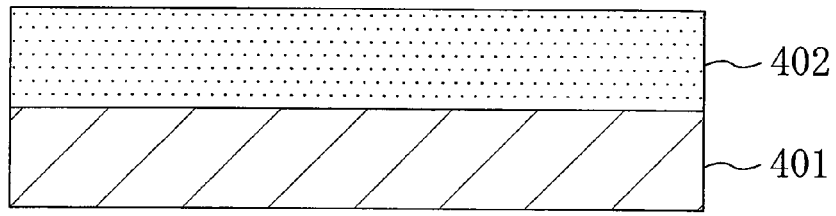
FIGS. 10A-10D are cross-sectional views illustrating process steps of a pattern forming method according to a fourth embodiment.

Next, as shown in FIG. 10A, the chemically amplified resist material is applied on the anti-reflection principal surface of a substrate 401 to form a first resist film 402 with a thickness of 0.12 μm.

Figure 10B:
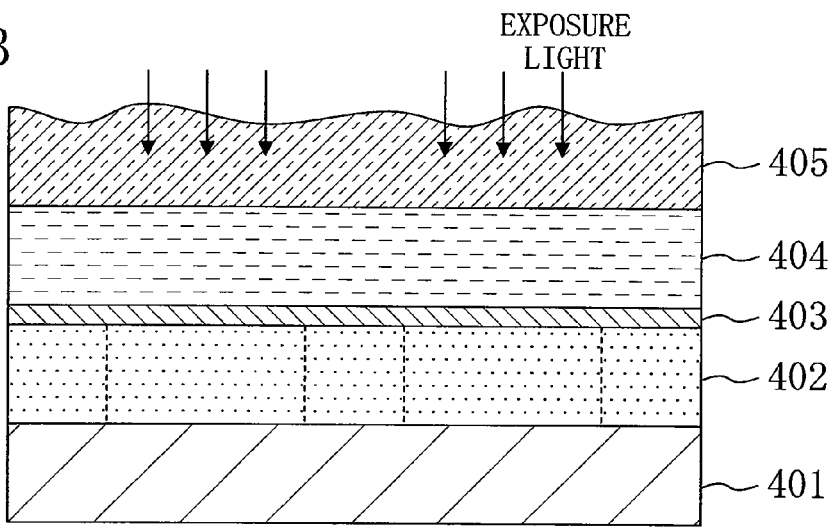

Then, as shown in FIG. 10B, a first barrier film 403 with a thickness of 0.05 μm is formed by, for example, spin coating on the first resist film 402 out of a barrier film material having the following composition:

| | |
|---|---|
| Base polymer: polyacrylic acid | 1 g |
| Solvent: n-butyl alcohol | 20 g |

Subsequently, with an immersion liquid 404 of water provided between the first barrier film 403 and a projection lens 405 by, for example, a puddle method, pattern exposure is carried out by irradiating the first resist film 402 with exposure light which is ArF excimer laser light having an NA of 1.07 through a first mask (not shown) with the first barrier film 403 interposed therebetween.

Figure 10C:
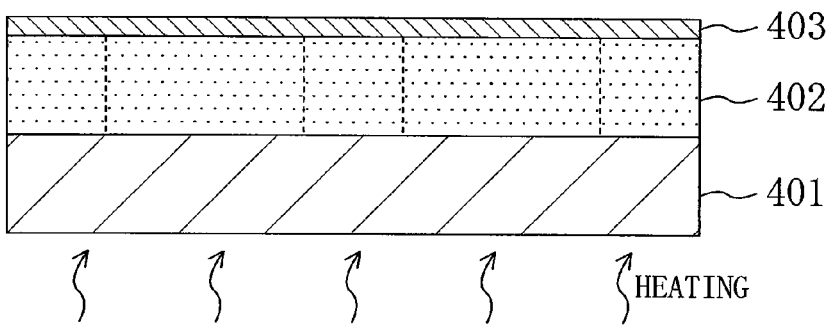

After the pattern exposure, as shown in FIG. 10C, the first resist film 402 is heated with, for example, a hot plate at a temperature of 105° C. for 60 seconds.

Figure 10D:
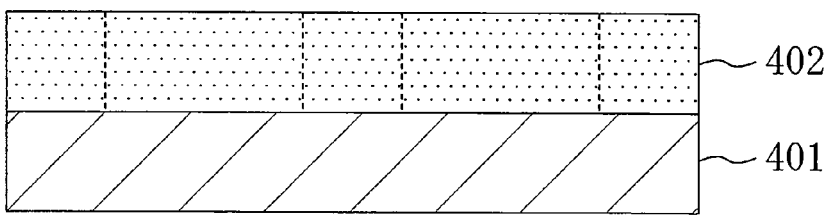

Then, as shown in FIG. 10D, the first barrier film 403 is removed with a 0.05 wt % tetramethylammonium hydroxide developer (i.e., a diluted developer).

Figure 11A:
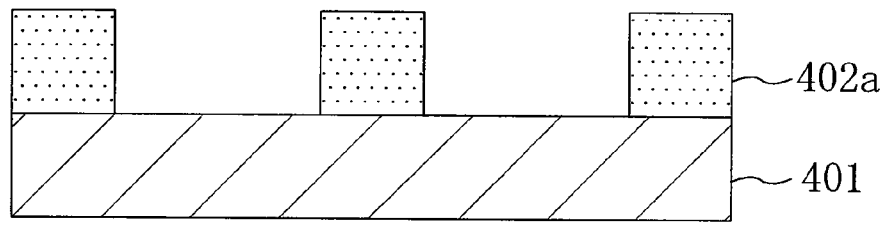
FIGS. 11A-11D are cross-sectional views illustrating process steps of the pattern forming method of the fourth embodiment.

Thereafter, as shown in FIG. 11A, development is performed with a 2.38 wt % tetramethylammonium hydroxide developer, thereby obtaining a first resist pattern 402a made of an unexposed portion of the first resist film 402 and having a line-and-space pattern with a pitch of 180 nm.

Figure 11B:
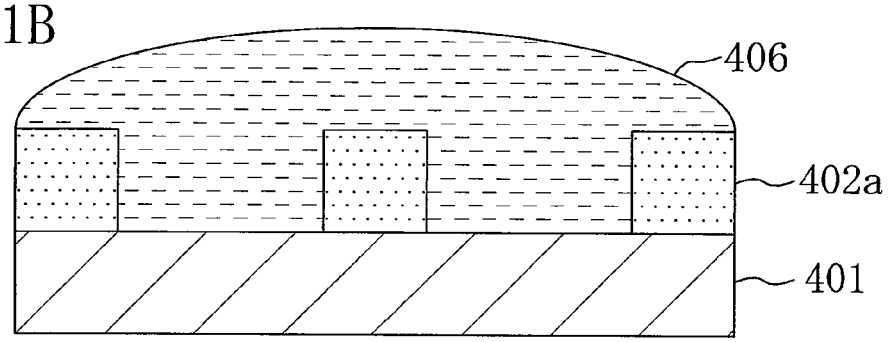
Figure 11C:
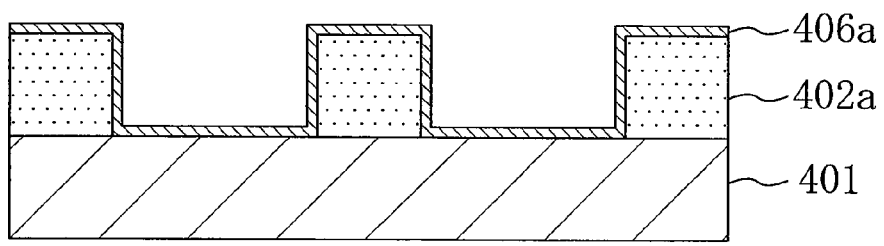

Then, as shown in FIG. 11B, the first resist pattern 402a is immersed by, for example, a puddle method for 90 seconds in a dispersion solution 406 in which fullerene C60 is dispersed in isobutyl alcohol in a concentration of 25 wt %. In this manner, as shown in FIG. 11C, fullerene C60 is attached to the surface of the first resist pattern 402a, thereby forming a nano-carbon layer 406a with a thickness of about 0.5 nm.

Figure 11D:
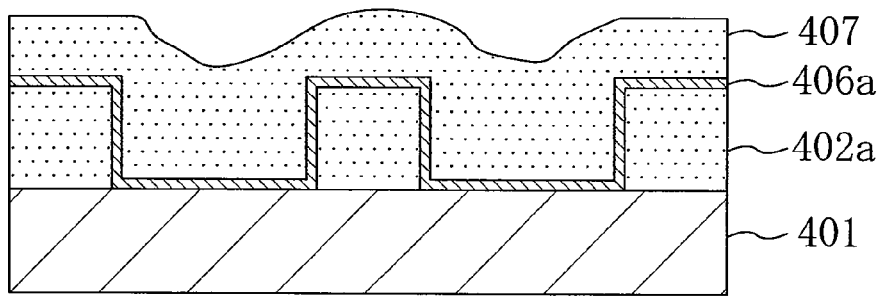

Thereafter, as shown in FIG. 11D, the chemically amplified resist material is applied again on the principal surface of the substrate 401 including the first resist pattern 402a on which the nano-carbon layer 406a is formed, thereby forming a second resist film 407 with a thickness of 0.12 μm. At this time, since the nano-carbon layer 406a to which fullerene C60 is attached is formed on the first resist pattern 402a, the rigidity of the first resist pattern 402a can be enhanced, and in addition, mixing of the first resist pattern 402a and the second resist film 407 can be prevented, thereby maintaining a desired shape of the first resist pattern 402a.

Figure 12A:
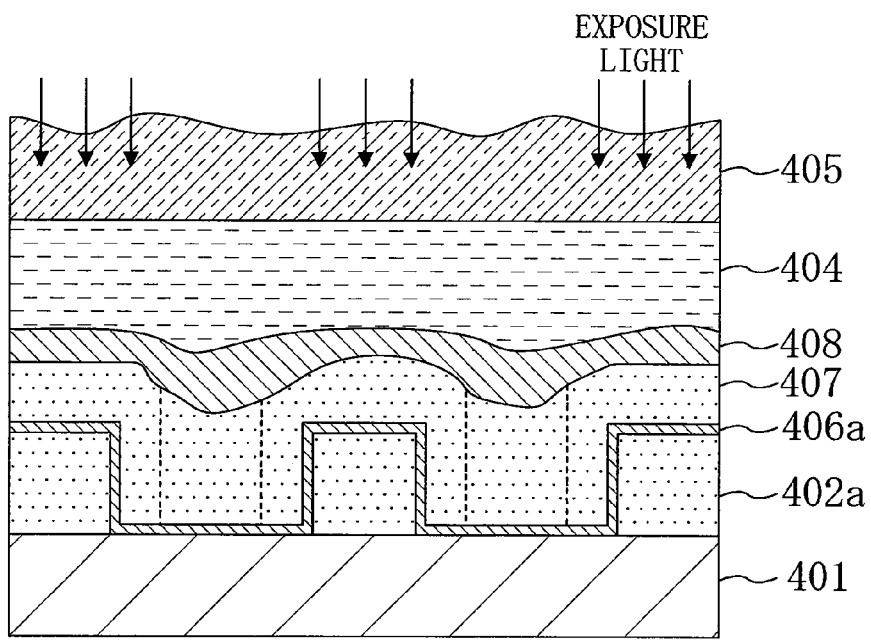
FIGS. 12A-12D are cross-sectional views illustrating process steps of the pattern forming method of the fourth embodiment.

Subsequently, as shown in FIG. 12A, spin coating, for example, is performed such that a second barrier film 408 with a thickness of 0.05 μm is formed on the second resist film 407 out of a barrier film material having the composition described above. Then, with an immersion liquid 404 of water provided between the second barrier film 408 and a projection lens 405 by, for example, a puddle method, pattern exposure is carried out by irradiating the second resist film 407 with exposure light which is ArF excimer laser light having an NA of 1.07 through a second mask (not shown).

Figure 12B:
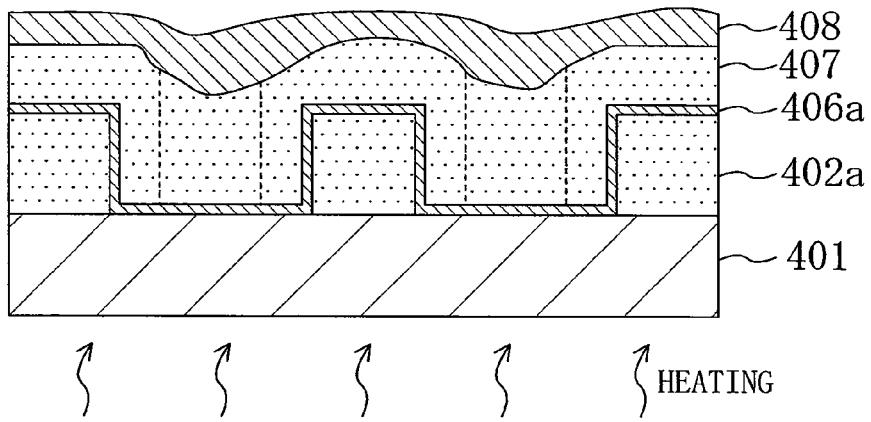

After the pattern exposure, as shown in FIG. 12B, the second resist film 407 is heated with, for example, a hot plate at a temperature of 105° C. for 60 seconds.

Figure 12C:
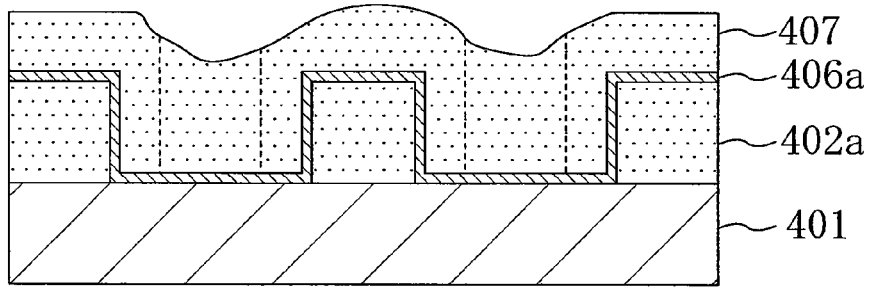

Then, as shown in FIG. 12C, the second barrier film 408 is removed with a 0.05 wt % tetramethylammonium hydroxide developer (i.e., a diluted developer).

Figure 12D:
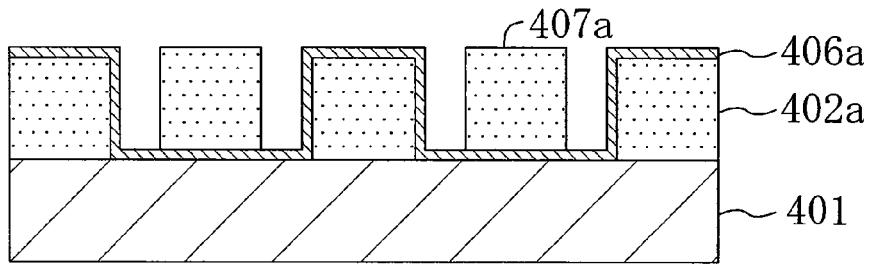
Figure 13A:
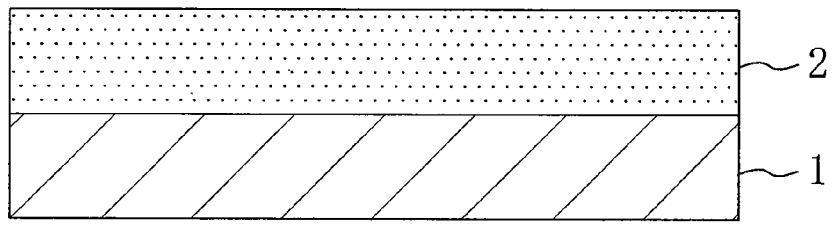
FIGS. 13A-13D are cross-sectional views illustrating process steps of a pattern forming method using a conventional double patterning technique.
Figure 13B:
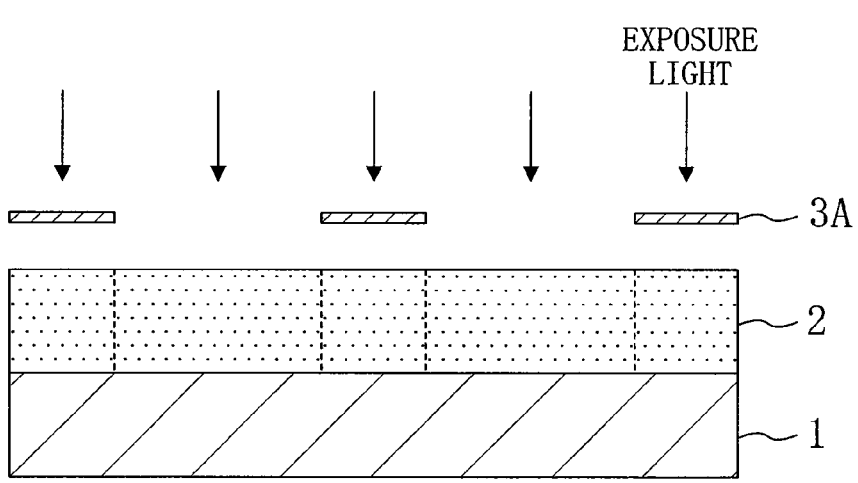
Figure 13C:
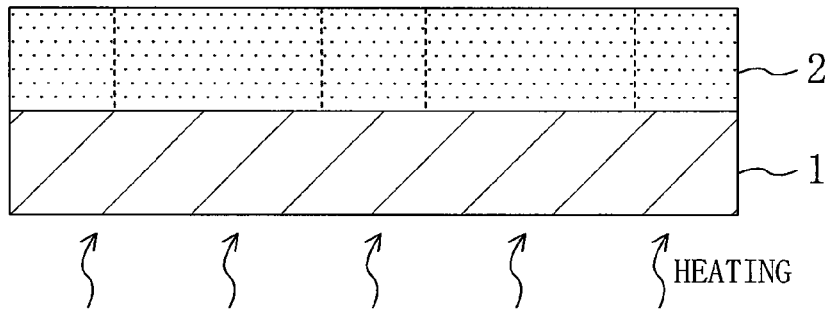
Figure 13D:
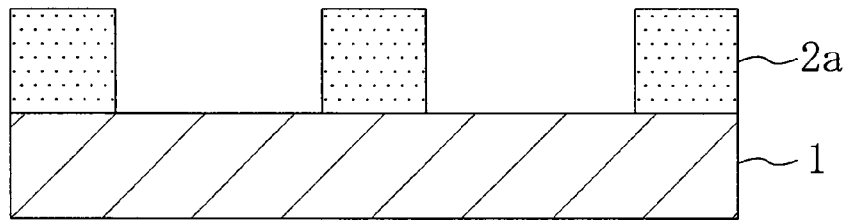
Figure 14A:
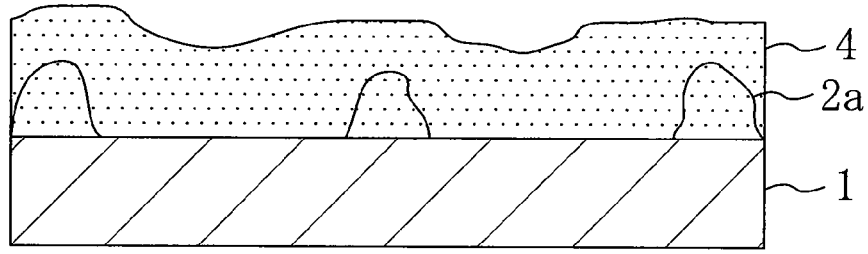
FIGS. 14A-14D are cross-sectional views illustrating process steps of the pattern forming method using the conventional double patterning technique.
Figure 14B:
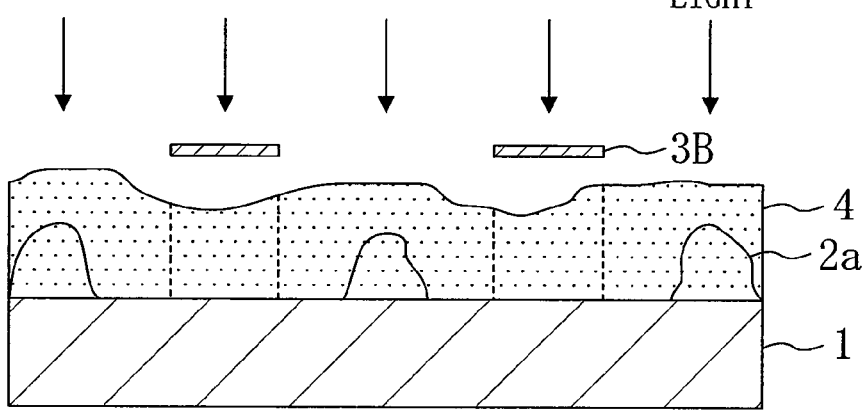
Figure 14C:
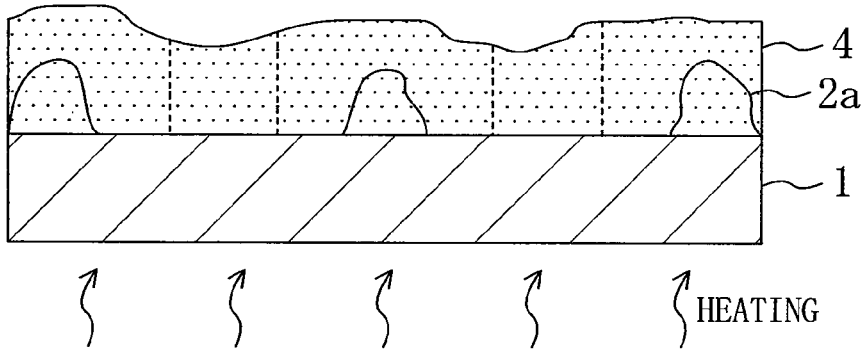
Figure 14D:
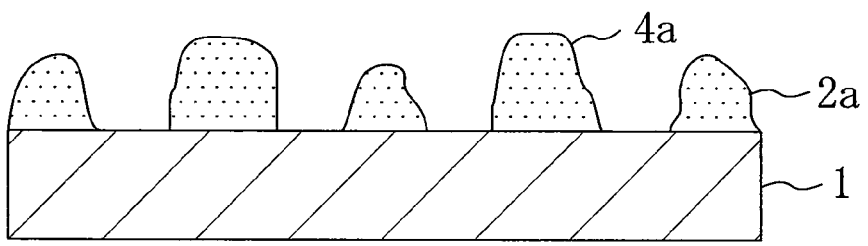

Thereafter, as shown in FIG. 12D, development is performed with a 2.38 wt % tetramethylammonium hydroxide developer, thereby obtaining a second resist pattern 407a made of an unexposed portion of the second resist film 407 and having a line-and-space pattern with a pitch of 180 nm.

In this manner, in the fourth embodiment, a very-fine pattern having a desired shape of a line-and-space pattern with a pitch of 90 nm can be obtained by utilizing the first resist pattern 402a whose desired shape is maintained with the nano-carbon layer 406a attached to the surface thereof and the second resist pattern 407a having a desired shape.

In the first to fourth embodiments, the nano-carbon material to be attached to the surface of the first resist pattern is made of carbon nanotubes, carbon nanohorns, or fullerene C60, but may be made of fullerene C70. Each of the carbon nanotubes and carbon nanohorns preferably has a diameter ranging from about 0.5 nm to about 1.0 nm and a maximum length ranging from about 4 μm to about 5 μm, irrespective of the number of layers constituting the carbon nanotubes or the carbon nanohorns. The size of the carbon nanotubes or the carbon nanohorns is not specifically limited as long as the nano-carbon material is attached to, and so-called in conformity with, the surface of the resist pattern. The thickness of the nano-carbon layer attached to the resist pattern may be set at any value as long as the rigidity of the resist pattern is enhanced and subsequent etching is not affected. The thickness of the nano-carbon layer is preferably in the range from about 0.5 nm to about 3 nm, and more preferably in the range from about 0.5 nm to about 1.5 nm.

In the foregoing description, the nano-carbon material is attached to the resist pattern by a puddle method is employed. However, the present invention is not limited to this example, and a spray method in which a liquid is sprayed to the surface of the resist pattern may be employed. In the puddle method, the concentration of the dispersion solution is preferably in the range from 1 wt % to 30 wt %, both inclusive, of the dispersion medium, and preferably in the range from about 10 wt % to about 20 wt %, both inclusive. The dispersion medium is preferably a liquid, such as water or alcohol, which does not damage the resist pattern. In addition to n-butyl alcohol, isobutyl alcohol, and sec-butyl alcohol used in the foregoing embodiments, tert-butyl alcohol or isoamyl alcohol may be used as alcohol for the dispersion medium. However, the present invention is not limited to these materials.

In the second to fourth embodiments, the immersion liquid is not limited to water, and may be perfluoropolyether.

Alternatively, cesium sulfate ($Cs_2SO_4$) or phosphoric acid ($H_3PO_4$) may be added to water as an immersion liquid in order to increase the refractive index of the immersion liquid. In this case, the concentration of cesium sulfate or phosphoric acid can be in the range from about 1 wt % to about 10 wt %. However, the present invention is not limited to this range.

The immersion liquid may contain an additive such as a surface active agent in the immersion liquid.

In the second to fourth embodiments, after formation of the first barrier film and the second barrier film, these barrier films may be individually heated. Then, the densenesses of the barrier films can be increased, thereby reducing penetration of the immersion liquid into the barrier films and mixing of the barrier films and the resist films. Since an excessive increase in the denseness of the barrier film by heating makes it difficult to remove the barrier film, the heating process needs to be performed within an appropriate temperature range, and is generally performed in the range from about 100° C. to about 150° C. However, the present invention is not limited to this range.

In the second to fourth embodiments, as base polymer for each of the barrier films, polyvinyl alcohol or polyacrylic acid is used. Alternatively, polyvinyl hexafluoroisopropyl alcohol may also be used.

In the second to fourth embodiments, the exposure light is ArF excimer laser light. Alternatively, KrF excimer laser light, $Xe_2$ laser light, $F_2$ laser light, KrAr laser light, and $Ar_2$ laser light may be used.

In the foregoing embodiments, the chemically amplified positive resist material is used as a resist material. However, this material is an example, and a chemically amplified negative resist material may be used. Further, the present invention is not limited to chemically amplified resists.

A pattern forming method according to the present invention can reduce pattern failures in double patterning to provide a fine pattern with a desired shape, and thus, is useful for, for example, fine-pattern forming methods for use in, for example, processes for fabricating semiconductor devices.

What is claimed is:

1. A pattern forming method, comprising the steps of:
   (a) forming a first resist film on a substrate;
   (b) irradiating the first resist film with exposure light through a first mask, thereby performing first pattern exposure;
   (c) developing the first resist film after step (b), thereby forming a first resist pattern out of the first resist film;
   (d) attaching a nano-carbon material to a surface of the first resist pattern after step (c);
   (e) forming a second resist film on the substrate including the first resist pattern after step (d);
   (f) irradiating the second resist film with exposure light through a second mask, thereby performing second pattern exposure; and
   (g) developing the second resist film after step (f), thereby forming a second resist pattern out of the second resist film.

2. The method of claim 1, wherein the nano-carbon material is one of carbon nanotubes, carbon nanohorns, and fullerenes.

3. The method of claim 1, wherein in step (d), the first resist pattern is immersed in a dispersion solution in which the nano-carbon material is dispersed.

4. The method of claim 3, wherein a dispersion medium of the dispersion solution is one of water and alcohol.

5. The method of claim 4, wherein alcohol as the dispersion medium of the dispersion solution is one of n-butyl alcohol, isobutyl alcohol, sec-butyl alcohol, tert-butyl alcohol, and isoamyl alcohol.

6. The method of claim 1, wherein the exposure light is one of KrF excimer laser light, $Xe_2$ laser light, ArF excimer laser light, $F_2$ laser light, KrAr laser light, $Ar_2$ laser light, extreme ultraviolet light, and electron beams.

7. A pattern forming method, comprising the steps of:
   (a) forming a first resist film on a substrate;
   (b) irradiating the first resist film with exposure light through a first mask with a liquid provided on the first resist film, thereby performing first pattern exposure;
   (c) developing the first resist film after step (b), thereby forming a first resist pattern out of the first resist film;
   (d) attaching a nano-carbon material to a surface of the first resist pattern after step (c);
   (e) forming a second resist film on the substrate including the first resist pattern after step (d);
   (f) irradiating the second resist film with exposure light through a second mask with a liquid provided on the second resist film, thereby performing second pattern exposure; and
   (g) developing the second resist film after step (f), thereby forming a second resist pattern out of the second resist film.

8. The method of claim 7, wherein the nano-carbon material is one of carbon nanotubes, carbon nanohorns, and fullerenes.

9. The method of claim 7, wherein in step (d), the first resist pattern is immersed in a dispersion solution in which the nano-carbon material is dispersed.

10. The method of claim 9, wherein a dispersion medium of the dispersion solution is one of water and alcohol.

11. The method of claim 10, wherein alcohol as the dispersion medium of the dispersion solution is one of n-butyl alcohol, isobutyl alcohol, sec-butyl alcohol, tert-butyl alcohol, and isoamyl alcohol.

12. The method of claim 7, further comprising the step (h) of forming a first barrier film on the first resist film between steps (a) and (b), wherein in step (b), the first pattern exposure is performed with the liquid provided on the first barrier film.

13. The method of claim 12, wherein step (c) includes the step of removing the first barrier film.

14. The method of claim 7, further comprising the step (j) of forming a second barrier film on the second resist film between steps (e) and (f), wherein in step (f), the second pattern exposure is performed with the liquid provided on the second barrier film.

15. The method of claim 14, wherein step (g) includes the step of removing the second barrier film.

16. The method of claim 12, further comprising the step (l) of heating the first barrier film between steps (h) and (b).

17. The method of claim 14, further comprising the step (m) of heating the second barrier film between steps (j) and (f).

18. The method of claim 7, wherein the liquid is one of water and perfluoropolyether.

19. The method of claim 7, wherein the exposure light is one of KrF excimer laser light, $Xe_2$ laser light, ArF excimer laser light, $F_2$ laser light, KrAr laser light, and $Ar_2$ laser light.

* * * * *